United States Patent
Sun et al.

(10) Patent No.: US 10,343,543 B2
(45) Date of Patent: Jul. 9, 2019

(54) SENSING CIRCUIT, HYBRID DRIVE CIRCUIT, AND SENSOR ASSEMBLY

(71) Applicant: Tyco Electronics (Shanghai) Co. Ltd., Shanghai (CN)

(72) Inventors: Ye Sun, Shanghai (CN); Xinhui Mao, Shanghai (CN); Jiacheng Zhou, Shanghai (CN); Jianwu Zhou, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 209 days.

(21) Appl. No.: 15/265,046

(22) Filed: Sep. 14, 2016

(65) Prior Publication Data
US 2017/0080820 A1 Mar. 23, 2017

(30) Foreign Application Priority Data
Sep. 18, 2015 (CN) .................... 2015 2 0726421 U

(51) Int. Cl.
| | |
|---|---|
| H02J 7/00 | (2006.01) |
| B60L 11/00 | (2006.01) |
| G01R 31/36 | (2019.01) |
| G01R 33/07 | (2006.01) |
| B60L 11/18 | (2006.01) |
| B60L 58/12 | (2019.01) |

(52) U.S. Cl.
CPC .......... *B60L 11/1861* (2013.01); *B60L 58/12* (2019.02); *G01R 31/36* (2013.01); *G01R 33/07* (2013.01); *H02J 7/007* (2013.01); *H02J 7/0068* (2013.01); *B60L 2260/26* (2013.01)

(58) Field of Classification Search
CPC ..... H02J 7/007; H02J 7/0068; B60L 11/1861; B60L 2260/26; G01R 31/36; G01R 33/07
USPC .......................... 320/134, 144, 153, 154, 160
See application file for complete search history.

(56) References Cited

U.S. PATENT DOCUMENTS

| | | | | |
|---|---|---|---|---|
| 3,869,657 | A * | 3/1975 | Shoji .................. | H02J 7/008 320/146 |
| RE34,317 | E * | 7/1993 | Ikeda ................. | G11B 20/1403 331/2 |
| 5,619,137 | A * | 4/1997 | Vig ..................... | G01R 33/07 324/207.12 |
| 6,362,632 | B1 * | 3/2002 | Livingston ........... | G01F 23/266 324/629 |
| 6,614,577 | B1 * | 9/2003 | Yu ........................ | G02F 1/163 351/44 |

(Continued)

*Primary Examiner* — Phallaka Kik
(74) *Attorney, Agent, or Firm* — Faegre Baker Daniels LLP

(57) ABSTRACT

The invention provides a sensing circuit having a driving apparatus, that is, a current drive circuit and a voltage drive circuit. The current drive circuit drives a sensor in a current drive mode, and the voltage drive circuit drives the sensor in a voltage drive mode. The sensing circuit further has a switch apparatus connected to the driving apparatus for controlling the driving apparatus, to enable the driving apparatus to switch between the current drive mode and the voltage drive mode. A temperature testing circuit with a negative temperature coefficient thermistor is further used to sense ambient temperature of the sensor, and the input voltage of the switch apparatus is changed by means of that the resistance of the thermistor changes as the temperature changes, so as to control on and off of the switch apparatus, to switch the drive mode of the sensor.

25 Claims, 3 Drawing Sheets

(56) References Cited

U.S. PATENT DOCUMENTS

| | | | | |
|---|---|---|---|---|
| 6,750,644 B1* | 6/2004 | Berkcan | | G01R 33/02 324/117 H |
| 7,307,486 B2* | 12/2007 | Pernia | | H03B 5/04 331/117 FE |
| 7,978,017 B2* | 7/2011 | Pernia | | H03B 5/04 331/1 R |
| 8,907,631 B1* | 12/2014 | Gurries | | H02J 7/0073 320/138 |
| 9,362,781 B2* | 6/2016 | Costa | | H02J 9/00 |
| 9,960,732 B2* | 5/2018 | Hoft | | H02S 50/10 |
| 9,991,782 B2* | 6/2018 | Coleman | | H02M 1/15 |
| 10,004,911 B2* | 6/2018 | Marnfeldt | | A61N 1/3787 |
| 10,073,136 B2* | 9/2018 | Milano | | G01R 31/2884 |
| 10,101,395 B2* | 10/2018 | Edwards | | G01R 31/3278 |
| 2002/0005709 A1* | 1/2002 | Nagai | | H02J 7/0031 320/150 |
| 2002/0167770 A1* | 11/2002 | Kato | | H02J 7/0029 361/58 |
| 2006/0082376 A1* | 4/2006 | Allen | | G01R 31/2884 324/522 |
| 2007/0103829 A1* | 5/2007 | Darshan | | H04L 12/10 361/90 |
| 2009/0015316 A1* | 1/2009 | Song | | G01K 1/20 327/513 |
| 2009/0295401 A1* | 12/2009 | Kamata | | G01R 31/006 324/509 |
| 2010/0070219 A1* | 3/2010 | Azancot | | H02J 5/005 702/62 |
| 2010/0188051 A1* | 7/2010 | Yamazaki | | H02J 7/0072 320/148 |
| 2010/0244805 A1* | 9/2010 | Fujita | | G01R 19/16552 323/299 |
| 2011/0001486 A1* | 1/2011 | Abouda | | G01R 31/007 324/537 |
| 2011/0057604 A1* | 3/2011 | Capella | | H02J 7/0004 320/107 |
| 2011/0248670 A1* | 10/2011 | Yamazaki | | H01M 2/0212 320/107 |
| 2012/0049628 A1* | 3/2012 | Vemulapalli | | H02J 7/345 307/43 |
| 2012/0049640 A1* | 3/2012 | Ichikawa | | H02J 5/005 307/99 |
| 2012/0154969 A1* | 6/2012 | Kim | | G01R 19/16571 361/93.9 |
| 2012/0212251 A1* | 8/2012 | Yanagishima | | H03K 17/61 324/762.01 |
| 2013/0093440 A1* | 4/2013 | Aumann | | H05B 33/0848 324/691 |
| 2013/0234512 A1* | 9/2013 | Kinjo | | H02M 3/1588 307/25 |
| 2013/0238048 A1* | 9/2013 | Almendinger | | A61N 1/3787 607/40 |
| 2014/0369380 A1* | 12/2014 | Ausserlechner | | G01R 33/0082 374/57 |
| 2015/0035367 A1* | 2/2015 | Fang | | H02J 9/061 307/64 |
| 2015/0196768 A1* | 7/2015 | Marnfeldt | | A61N 1/3787 607/60 |
| 2015/0198647 A1* | 7/2015 | Atwood | | G01R 31/028 324/548 |
| 2015/0362550 A1* | 12/2015 | Wibben | | G01R 31/2853 324/750.3 |
| 2016/0091558 A1* | 3/2016 | Schulze-Icking-Konert | | H03K 17/06 324/764.01 |
| 2016/0124055 A1* | 5/2016 | Ausserlechner | | G01R 33/075 324/251 |
| 2016/0131690 A1* | 5/2016 | Ueno | | G01R 19/16538 324/764.01 |
| 2016/0164430 A1* | 6/2016 | Chen | | H02M 1/32 363/89 |
| 2016/0204707 A1* | 7/2016 | Takahara | | H02M 1/4258 363/16 |
| 2016/0273994 A1* | 9/2016 | McNab | | G01M 3/18 |
| 2016/0308516 A1* | 10/2016 | Narayan | | G01R 19/1659 |
| 2016/0331211 A1* | 11/2016 | Fujisawa | | A61B 1/00 |
| 2016/0380552 A1* | 12/2016 | Chung | | G01R 19/04 363/84 |
| 2017/0053590 A1* | 2/2017 | Song | | G01R 19/1659 |
| 2017/0063078 A1* | 3/2017 | Ma | | G05B 19/048 |
| 2017/0133842 A1* | 5/2017 | Freeman | | H02J 1/00 |
| 2017/0155258 A1* | 6/2017 | Takano | | G05B 19/048 |
| 2017/0229857 A1* | 8/2017 | Kral | | H02H 7/28 |
| 2017/0229911 A1* | 8/2017 | Ettes | | H02J 50/10 |

* cited by examiner

SENSING CIRCUIT, HYBRID DRIVE CIRCUIT, AND SENSOR ASSEMBLY

CLAIM OF PRIORITY

The present application claims priority from Chinese patent application CN 201520726421.2, filed Sep. 18, 2015; the subject matter of which is incorporated herein by reference.

TECHNICAL FIELD

The present invention relates to a vehicle battery management system, and particularly to a sensing circuit for monitoring battery charging and discharging states and a related assembly.

BACKGROUND

Sensors have been used to dynamically monitor the charging/discharging current and working state of a vehicle battery, and feed back an acquired signal to a battery management system. The battery management system manages and controls the battery appropriately and effectively in conjunction with other acquired performance parameter(s), so as to ensure desirable battery performance and normal operation of electrical equipments.

According to design of an existing sensor (for example, a Hall sensor), a zero-drift phenomenon occurs at extreme high and low temperatures (especially at subzero temperatures): e.g., when a magnetic field is zero, an abnormal sensing signal is sent by the sensor, which makes the vehicle battery management system cannot work effectively.

FIG. 1 shows zero-drift curves of a sensor that vary with temperature in two drive modes: a current drive mode and a voltage drive mode, wherein the abscissa represents the ambient temperature T (° C.) of the sensor, and the ordinate represents the drift voltage output by the sensor. The dotted line 101 represents the drift curve in the current drive mode, and the solid line 102 represents the drift curve in the voltage drive mode. As can be seen from FIG. 1, when the ambient temperature is lower than 50° C., the output drift of the sensor in the current drive mode is greater than that of the sensor in the voltage drive mode; especially when the ambient temperature is below −40° C., the drift voltage in the current drive mode is 25 mV greater than that in the voltage drive mode; and when the ambient temperature is higher than 50° C., the output drift of the sensor in the current drive mode is smaller than that of the sensor in the voltage drive mode.

SUMMARY OF THE INVENTION

The present invention aims to solve the problem of large zero drift as mentioned above. A first objective of the present invention is to provide a sensing circuit capable of switching the drive mode of a Hall sensor at different ambient temperatures.

According to the first aspect of the invention, a sensing circuit is provided and can comprise a sensor and a driving apparatus connected to the sensor for driving the sensor. The driving apparatus comprises a current drive circuit and a voltage drive circuit. The current drive circuit drives the sensor in a current drive mode, and the voltage drive circuit drives the sensor in a voltage drive mode. The sensing circuit further comprises a switch apparatus connected to and controls the driving apparatus, to enable the driving apparatus to switch between the current drive mode and the voltage drive mode.

According to the foregoing sensing circuit, the sensor is a Hall sensor, which senses a change in magnetic flux. The output of the Hall sensor changes as the magnetic flux changes.

According to the foregoing sensing circuit, the current drive circuit comprises a current drive path. The current drive path comprises a first path segment and a second path segment. Two ends of the sensor are connected to the first path segment and the second path segment respectively. A current in the current drive path flows from the first path segment to the sensor, passes through the sensor, and flows out of the second path segment. The voltage drive circuit comprises a voltage drive path. The switch apparatus connects the voltage drive circuit in parallel to the first path segment and the second path segment to form the voltage drive path, or disconnects the voltage drive circuit from the first path segment or the second path segment.

According to the foregoing sensing circuit, the first path segment comprises a first resistor, and the second path segment comprises a second resistor.

According to the foregoing sensing circuit, one end of the voltage drive path is connected to the switch apparatus, and the voltage drive path is connected in parallel to the first path segment and the second path segment by using the switch apparatus.

According to the foregoing sensing circuit, the voltage drive circuit comprises a voltage regulator tube.

According to the foregoing sensing circuit, the switch apparatus comprises a transistor or a metal-oxide semiconductor (MOS) transistor.

According to the foregoing sensing circuit, the sensing circuit further comprises a switch control circuit, wherein an output of the switch control circuit is connected to an input of the switch apparatus, and the switch control circuit generates a control signal in a sensed ambient temperature range. In response to the control signal, the switch apparatus is in an on state or an off state. When in the on state, the switch apparatus connects the voltage drive circuit in parallel to the first path segment and the second path segment. When in the off state, the switch apparatus disconnects the voltage drive circuit from the first path segment or the second path segment.

According to the foregoing sensing circuit, the switch control circuit comprises a comparator and a temperature testing circuit.

According to the foregoing sensing circuit, the comparator is provided with a first input end, a second input end, and an output end. The output end is connected to an input end of the switch apparatus. The first input end is connected to a stable threshold voltage (V0). The second input end is connected to a sensing voltage (V) output by the temperature testing circuit.

According to the foregoing sensing circuit, the sensor has a temperature drift region. The threshold voltage refers to a threshold voltage that causes the comparator to send the control signal when the temperature testing circuit senses that the ambient temperature reaches the temperature drift region. The temperature drift region refers to a temperature region in which a zero drift of the sensor under current drive is greater than that of the sensor under voltage drive when no current passes through the sensor. The zero drift refers to a state that an error signal is output by the sensor when a measured current is zero.

According to the foregoing sensing circuit, the temperature testing circuit comprises a thermistor (R7) and multiple voltage dividing resistors (R3, R4, R5). The voltage dividing resistors (R3, R4, R5) comprise a third resistor (R3) and a fourth resistor (R4) that are connected in series, and comprise a fifth resistor (R5) connected in series to the thermistor (R7). The first input end is connected between the third resistor (R3) and the fourth resistor (R4), so as to be connected to the threshold voltage (V0) formed through voltage dividing performed by the third resistor (R3) and the fourth resistor (R4). The second input end is connected between the thermistor (R7) and the fifth resistor (R5), so as to be connected to the sensing voltage (V) formed through voltage dividing performed by the thermistor (R7) and the fifth resistor (R5).

According to the foregoing sensing circuit, when the voltage drive path is disconnected from the first path segment or the second path segment, the driving apparatus is a current-mode drive circuit. When the voltage drive path is connected in parallel to the first path segment and the second path segment, the driving apparatus is a voltage-mode drive circuit.

According to the foregoing sensing circuit, the sensed ambient temperature range comprises a first ambient temperature range and a second ambient temperature range. The comparator outputs a first level control signal in the first ambient temperature range, and in response to the first level control signal, the switch apparatus is in the on state. The comparator outputs a second level control signal in the second ambient temperature range, and in response to the second level control signal, the switch apparatus is in the off state.

According to the foregoing sensing circuit, the first ambient temperature range is a temperature range lower than the temperature drift region. The second ambient temperature range is a temperature range higher than the temperature drift region.

A second objective of the present invention is to provide a hybrid drive circuit for driving a sensing element to work in two drive modes. According to a second aspect of the invention, a hybrid drive circuit is used to be connected to two ends of a driven electronic element and to provide a driving power supply. The hybrid drive circuit comprises a current drive circuit, a voltage drive circuit, a switch apparatus, and a switch control circuit.

The current drive circuit comprises a first circuit segment and a second circuit segment. The first circuit segment and the second circuit segment are connected to two ends of the driven electronic element respectively, and form a current drive path; the circuit segments are powered to form a path segment. The voltage drive circuit has a first end and a second end. The switch apparatus has a first end and a second end, and the second end of the voltage drive circuit is connected to the first end of the switch apparatus. The switch control circuit provides a control signal to the switch apparatus, and in response to the control signal, the switch apparatus is in an on state or an off state. The first end of the voltage drive circuit and the second end of the switch apparatus are two output ends of the hybrid drive circuit, and the two output ends are connected to the two ends of the driven electronic element. When in the on state, the switch apparatus enables the voltage drive circuit to be connected to the second end of the switch apparatus. When in the off state, the switch apparatus enables the voltage drive circuit to be disconnected from the second end of the switch apparatus.

According to the foregoing hybrid drive circuit, when in the on state or the off state, the switch apparatus enables the voltage drive circuit to be connected to the first circuit segment and the second circuit segment or to be disconnected from the first circuit segment or the second circuit segment.

According to the foregoing hybrid drive circuit, the hybrid drive circuit further comprises a first resistor (R1) and a second resistor (R2). The first circuit segment comprises the first resistor (R1), and the second circuit segment comprises the second resistor (R2).

According to the foregoing hybrid drive circuit, the switch control circuit comprises a comparator and a temperature testing circuit, and the temperature testing circuit senses ambient temperature, and outputs a sensing signal to the comparator.

According to the foregoing hybrid drive circuit, the comparator is provided with a first input end, a second input end, and an output end. The output end is connected to an input end of the switch apparatus. The first input end is connected to a stable threshold voltage (V0). The second input end is connected to a sensing voltage (V) output by the temperature testing circuit.

According to the foregoing hybrid drive circuit, when the ambient temperature is in a first ambient temperature range, the output sensing voltage (V) is higher than the threshold voltage (V0), and the comparator outputs a first level control signal to the switch apparatus through the output end. When the ambient temperature is in a second ambient temperature range, the sensing voltage (V) is lower than the threshold voltage (V0), and the comparator outputs a second level control signal to the switch apparatus through the output end.

According to the foregoing hybrid drive circuit, the first ambient temperature range is a temperature range lower than a temperature drift region. The second ambient temperature range is a temperature range higher than the temperature drift region.

According to the foregoing hybrid drive circuit, when the comparator outputs the first level control signal, the switch apparatus, in response to the first level control signal, is in the on state. When the comparator outputs the second level control signal, the switch apparatus, in response to the second level control signal, is in the off state.

According to the foregoing hybrid drive circuit, the hybrid drive circuit further comprises a Hall element having the temperature drift region. The temperature drift region refers to a temperature region in which a zero drift of the sensor under current drive is greater than that of the sensor under voltage drive when no current passes through the sensor. The zero drift refers to a state that an error signal is output by the sensor when a measured current is zero.

According to the foregoing hybrid drive circuit, the threshold voltage (V0) refers to a threshold voltage that causes the comparator to send the control signal when the temperature testing circuit senses that the ambient temperature reaches the temperature drift region.

According to the foregoing hybrid drive circuit, the temperature testing circuit comprises a thermistor (R7) and multiple voltage dividing resistors (R3, R4, R5). The voltage dividing resistors (R3, R4, R5) comprise a third resistor (R3) and a fourth resistor (R4) that are connected in series, and comprise a fifth resistor (R5) connected in series to the thermistor (R7). The first input end is connected between the third resistor (R3) and the fourth resistor (R4), so as to be connected to the threshold voltage (V0) formed through voltage dividing performed by the third resistor (R3) and the fourth resistor (R4). The second input end is connected between the thermistor (R7) and the fifth resistor (R5), so as to be connected to the sensing voltage (V) formed through voltage dividing performed by the thermistor (R7) and the fifth resistor (R5).

A third objective of the present invention is to provide a sensor product. According to the third aspect of the invention, a sensor assembly is provided and comprises a sensor and the foregoing hybrid drive circuit. The first circuit segment of the hybrid drive circuit is connected to a drive input end of the sensor, and the second circuit segment of the hybrid drive circuit is connected to another drive input end of the sensor.

According to the foregoing sensor assembly, the hybrid drive circuit is mounted on a printed circuit board (PCB).

The present invention provides a sensing circuit and a sensor assembly, comprising a sensor and a hybrid drive circuit. The hybrid drive circuit mainly comprises a driving apparatus (a drive circuit). The driving apparatus comprises a current drive circuit and a voltage drive circuit. The current drive circuit drives the sensor in a current drive mode, and the voltage drive circuit drives the sensor in a voltage drive mode. The hybrid drive circuit further comprises a switch apparatus connected to the driving apparatus. The switch apparatus controls the driving apparatus, to enable the driving apparatus to switch between the current drive mode and the voltage drive mode. According to the present invention, a temperature testing circuit with a negative temperature coefficient thermistor being the main component is further used to sense ambient temperature of the sensor, and the input voltage of the switch apparatus is changed by means of that the resistance of the thermistor changes as the temperature changes, so as to control the on and off state of the switch apparatus, to switch the drive mode of the Hall sensor. Therefore, the sensor is driven in different modes at different temperatures, so that the zero drift of the output of the product is reduced, and reliability of a vehicle battery management system is improved.

BRIEF DESCRIPTION OF DRAWINGS

The following description is set forth in connection with the attached drawing figures, which are not necessarily to scale, emphasis instead generally being placed upon illustrating the principles of the invention. In the drawing figures.

DETAILED DESCRIPTION OF EMBODIMENTS

Various embodiments of the present invention are described below with reference to the accompanying drawings that constitute a part of the specification. It should be understood that, although directional terms used in the present invention, such as "front", "rear", "upper", "lower", "left", and "right", refer to exemplary structural parts and elements in the present invention, these terms used herein are only for ease of description, and are determined based on exemplary directions shown in the accompanying drawings. The embodiments disclosed by the present invention may be disposed according to different directions, so that these directional terms are for illustration only, but shall not be construed as limiting the present invention. In possible cases, the same or similar reference signs used in the present invention refer to the same components.

Figure 2:
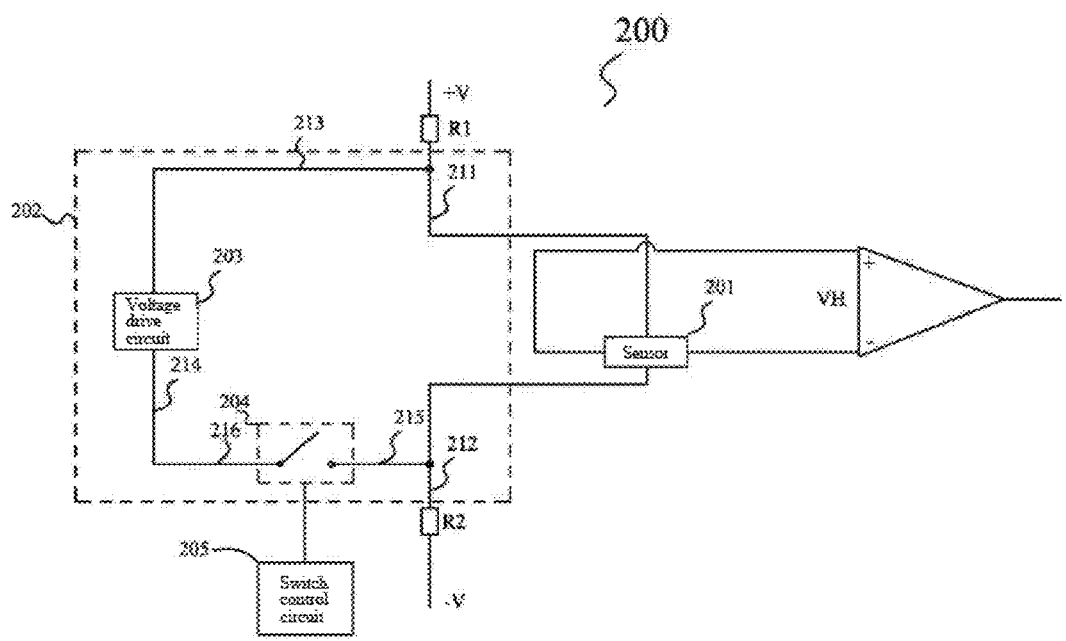
FIG. 2 is a schematic view of the basic structure of a sensing circuit 200 according to the present invention.

FIG. 2 is a schematic view of the basic structure of a sensing circuit 200 according to the present invention. As shown in FIG. 2, the sensing circuit 200 comprises a sensor 201 and a driving apparatus (a drive circuit) 202 (represented by a dotted line in FIG. 2) connected to the sensor 201. The driving apparatus 202 provides the sensor 201 (a driven element) with a driving (excitation) voltage or current to enable the sensor 201 to work. The driving apparatus 202 comprises a current drive circuit and a voltage drive circuit.

The voltage drive circuit 203 comprises a first end 213, a second end 214, a switch apparatus 204, and a switch control circuit 205. The switch apparatus 204 has a first end 216 and a second end 215, and the second end 214 of the voltage drive circuit 203 is connected to the first end 216 of the switch apparatus 204. The switch control circuit 205 provides a control signal to the switch apparatus 204, and in response to the control signal, the switch apparatus 204 is in an on state or an off state. The first end 213 of the voltage drive circuit 203 and the second end 215 of the switch apparatus 204 are two output ends 213, 215 of the drive circuit 202, and the two output ends 213, 215 are connected to two ends of the driven electronic element, namely the sensor 201. When the switch apparatus 204 is in the on state, the first end 216 of the switch apparatus 204 is connected to the second end 215 of the switch apparatus 204, enabling the voltage drive circuit 203 to be connected to the second end 215 of the switch apparatus 204. When the switch apparatus 204 is in the off state, the first end 216 of the switch apparatus 204 is disconnected from the second end 215 of the switch apparatus 204, enabling the voltage drive circuit 203 to be disconnected from the second end 215 of the switch apparatus 204.

When the two output ends 213, 215 are connected to the two ends of the sensor 201 and a power supply is connected, a current passing through the driven electronic element 201 forms the current drive circuit. The current drive circuit comprises a current drive path (211, 201, 212). As also shown in FIG. 2, the current drive path (211, 201, 212) comprises a first path segment 211 and a second path segment 212. The first path segment 211 and the second path segment 212 are connected to two drive ends of the driven element, namely the sensor 201. The current in the current drive path (211, 201, 212) flows from the first path segment 211 to the sensor 201, passes through the sensor 201, and flows out of the second path segment 212, and in this case, the sensor 201 is driven in a current drive mode. The first path segment 211 comprises a first resistor R1, and the second path segment 211 comprises a second resistor R2.

When the voltage drive circuit is connected to the first path segment 211 and the second path segment 212, the voltage drive circuit forms a voltage drive path (213, 203, 204, 215). Two ends of the voltage drive path (213, 203, 204, 215) are connected to the first path segment 211 and the second path segment 212 respectively, and can be selectively disconnected from the first path segment 211 or the second path segment 212. The switch apparatus 204 connects the voltage drive path (213, 203, 204, 215) in parallel to the first path segment 211 and the second path segment 212, or disconnects the voltage drive path (213, 203, 204, 215) from the first path segment 211 or the second path segment 212.

When the voltage drive path (213, 203, 204, 215) is connected in parallel to the first path segment 211 and the second path segment 212, the driving apparatus 202 drives the sensor 201 in a voltage drive mode. When the voltage drive path (213, 203, 204, 215) is disconnected from the first path segment 211 or the second path segment 212, the driving apparatus 202 drives the sensor 201 in the current drive mode.

Figure 1:
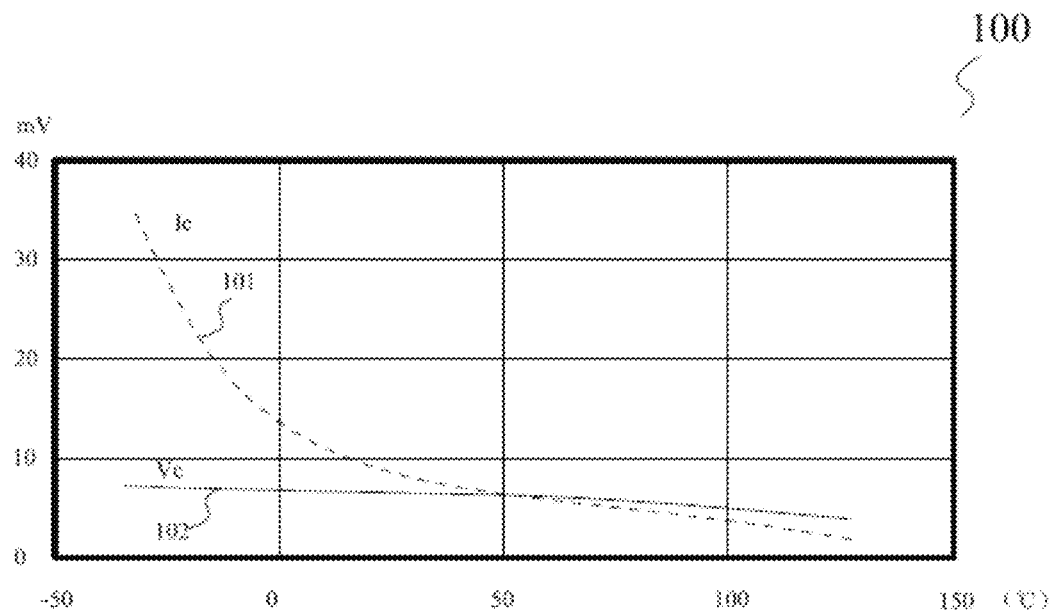
FIG. 1 shows zero-drift curves of a sensor 201 at different ambient temperatures in the prior art.

The current drive circuit drives the sensor 201 in the current drive mode, and the voltage drive circuit drives the sensor 201 in the voltage drive mode. The switch apparatus 204 connected to the driving apparatus 202 controls the driving apparatus 202, to enable the driving apparatus 202 to switch between the current drive mode and the voltage drive mode. Due to the semiconductor properties of the sensor, properties presented by the sensor in the voltage drive mode are different from those presented by the sensor in the current drive mode. For example, as shown in FIG. 1, the zero drift of a Hall sensor in the current drive mode is different from that of the Hall sensor in the voltage drive mode.

The sensing circuit 200 in FIG. 2 further comprises the switch control circuit 205 connected to the switch apparatus 204. The switch control circuit 205 may sense the ambient temperature of the sensor 201, and send a control signal to the switch apparatus 204 according to different ambient temperatures to enable the switch apparatus 204 to be turned off or turned on, so as to disconnect the voltage drive circuit from the first path segment 211 or the second path segment 212 or connect the voltage drive circuit to the first path segment 211 and the second path segment 212. The aim of the switch control circuit 205 is to change the drive mode of the sensor 201.

In an embodiment, the driven element in the present invention is a Hall sensor. But in fact, the driven element in the present invention is not limited to a Hall sensor; any type of driven element that needs to be driven alternately in a voltage/current drive mode, such as another type of sensor, is applicable to the circuits of the driving apparatus 202 of the present invention.

In addition, an output end of the sensor 201 is further connected to an amplifying circuit (a transistor) 210 used to amplify an output signal VH of the sensor 201.

Figure 3:
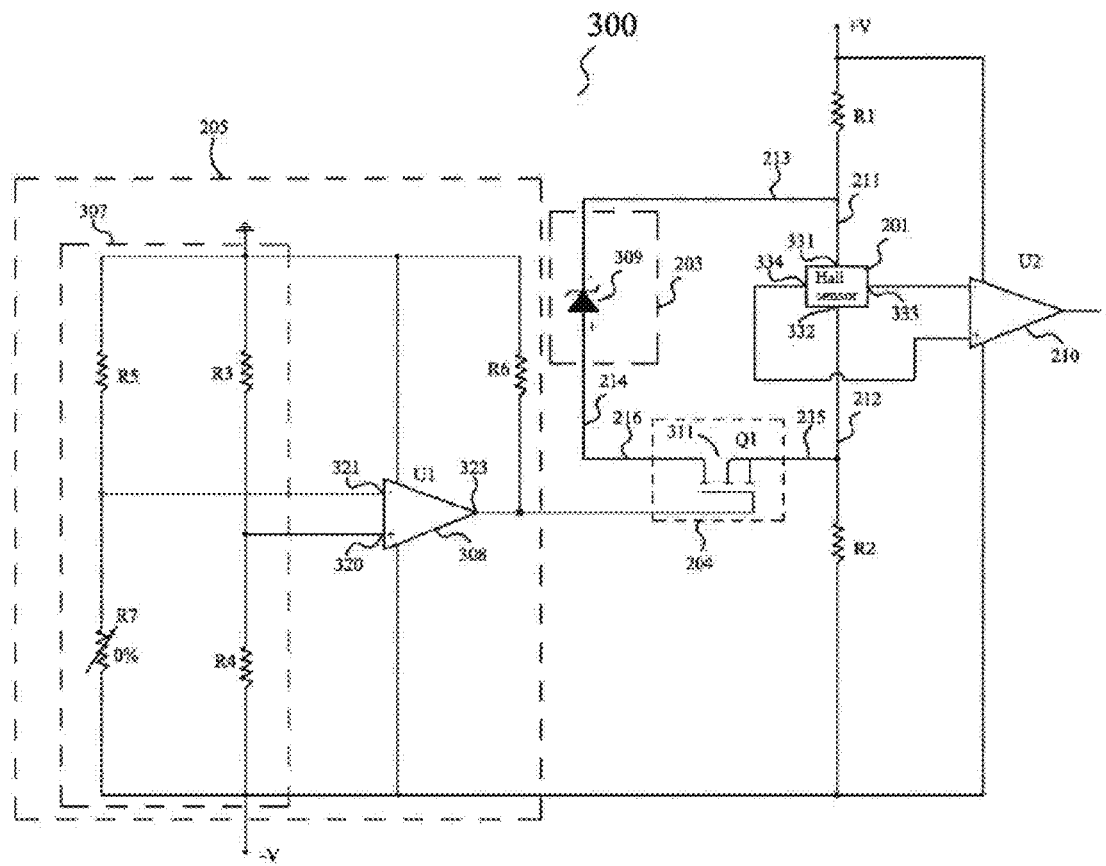
FIG. 3 is a schematic view of the specific circuit configuration of the sensing circuit 200 according to the present invention.

FIG. 3 is a schematic view of a specific circuit configuration of the sensing circuit 200 according to the present invention. As shown in FIG. 3, the sensing circuit 200 mainly comprises a current drive circuit and a voltage drive circuit. The current drive circuit comprises a current drive path (211, 201, 212), which mainly comprises a first resistor R1, a first path segment 211, a sensor 201, a second path segment 212 and a second resistor R2 connected in series in FIG. 3. Two ends of the current drive path (211, 201, 212) are connected to voltages +V and −V respectively. The operating voltage is about 12-18V. The first resistor R1 and the second resistor R2 play a role in voltage dividing.

The sensor 201 has four pins, namely an upper pin 331, a lower pin 332, a right pin 333, and a left pin 334, among which the upper pin 331 (an input end) is connected to the first path segment 211, the lower pin 332 (an output end) is connected to the second path segment 212; the right pin 333 and the left pin 334 are output ends of a sensing signal, and are connected to an input end of an amplifying circuit (a transistor) 210.

The voltage drive circuit comprises a voltage drive path (213, 203, 204, 215) which comprises a first end 213, a voltage regulator tube 309 (203 in FIG. 2), a switch apparatus 204, and a second end 215. The first end 213 and the second end 215 are connected to the first path segment 211 and the second path segment 212 respectively. The switch apparatus 204 is connected between the voltage regulator tube 309 and the second end 215 in FIG. 3. In fact, the switch apparatus 204 may be connected at any other position in the voltage drive path (213, 203, 204, 215), for example, between the first end 213 and the voltage regulator tube 309, provided that the switch apparatus 204 can control the voltage drive path (213, 203, 204, 215) to be opened or closed. The negative electrode of the voltage regulator tube 309 faces the first end 213, and the positive electrode of the voltage regulator tube 309 faces the second end 215. When the voltage drive path (213, 203, 204, 215) is closed and connected to the first path segment 211 and the second path segment 212, the voltage drive path (213, 203, 204, 215) is a constant-voltage drive circuit with a voltage lower than (or equal to) 2V.

The switch apparatus 204 is a transistor 311 or a MOS transistor. The drain and the source of the transistor 311 are connected to the voltage drive path (213, 203, 204, 215), and the input end, namely the gate, of the transistor 311 is connected to a switch control circuit 205. When the switch control circuit 205 outputs a control signal (for example, a high level control signal) to the input end of the transistor 311, the drain and the source of the switch apparatus 204 are in a connected state, and the voltage drive path (213, 203, 204, 215) is closed and connected to the current drive path (211, 201, 212); conversely, when no control signal is output to the input end of the transistor 311 by the switch control circuit 205, the drain and the source of the switch apparatus 204 are in a disconnected state, and the voltage drive path (213, 203, 204, 215) is open and therefore cannot be connected to the current drive path (211, 201, 212).

The switch control circuit 205 comprises a comparator 308 and a temperature testing circuit 307. The comparator 308 is provided with a first input end 320, a second input end 321, and an output end 323. The output end 321 is connected to the input end of the switch apparatus 204 (the transistor 311). The first input end 320 is connected to a stable threshold voltage V0. The second input end 321 is connected to a sensing voltage V output by the temperature testing circuit 307. The temperature testing circuit 307 comprises a thermistor R7 and multiple voltage dividing resistors R3, R4, R5. The voltage dividing resistors R3, R4, R5 comprise a third resistor R3 and a fourth resistor R4 that are connected in series, and comprise a fifth resistor R5 connected in series to the thermistor R7. The first input end 320 is connected between the third resistor R3 and the fourth resistor R4, so as to be connected to the threshold voltage V0 formed through voltage dividing caused by different resistances of the third resistor R3 and the fourth resistor R4. The second input end 321 is connected between the thermistor R7 and the fifth resistor R5, so as to be connected to the sensing voltage V formed through voltage dividing caused by different resistances of the thermistor R7 and the fifth resistor R5. When the resistance of the thermistor R7 changes, the sensing voltage V formed through the voltage dividing performed by the thermistor R7 and the fifth resistor R5 also changes. When the sensing voltage V is higher than the threshold voltage V0, the comparator 308 outputs a high-level control signal to the input end of the transistor 311, so that the drain and the source of the transistor 311 are connected, that is, the switch apparatus 204 is turned on.

The resistance of the thermistor R7 changes as ambient temperature changes. When the ambient temperature decreases, the resistance of the thermistor R7 increases, and vice versa.

In the present invention, the Hall sensor 201 is driven in a current drive mode at normal temperature, but when the ambient temperature is too low (below 0° C. as shown in FIG. 1), the output drift of the Hall sensor 201 increases, and in this case the Hall sensor 201 needs to be driven in a voltage drive mode instead, so as to reduce the drift. The temperature region, in which the drift is too large, is the temperature drift region of the present invention. According to the present invention, the thermistor R7 is used to sense the temperature-drift region of the Hall sensor 201, and when the temperature reaches (or is close to) the temperature drift region, the switch control circuit sends a control signal, and the driving apparatus 202 switches to the voltage drive circuit to operate.

According to the present invention, the threshold voltage V0 is set by means of different resistances of the third resistor R3 and the fourth resistor R4, and the value of the threshold voltage V0 is determined according to the thermistor R7, the comparator 308, and the temperature drift region of the Hall sensor 201. When the thermistor R7 senses that the ambient temperature of the Hall sensor 201 reaches the temperature drift region, the resistance of the thermistor R7 increases, and when the sensing voltage V increases to be greater than the threshold voltage V0, the comparator 308 sends a control signal to the transistor 311 to make the voltage drive path (213, 203, 204, 215) closed.

Figure 4:
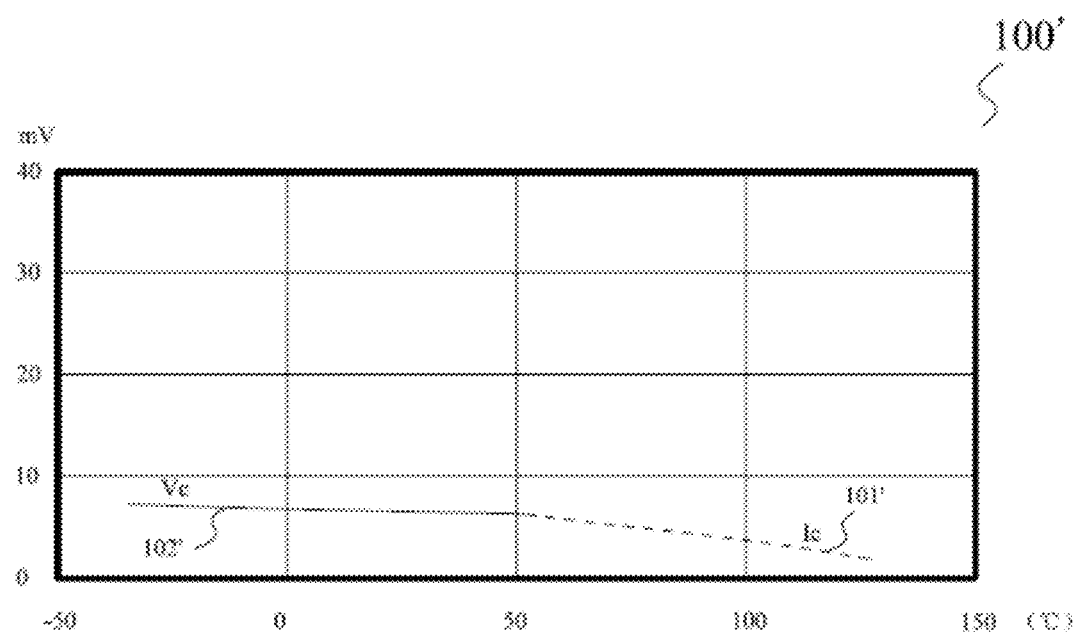
FIG. 4 is a schematic view of the work result of the sensing circuit 200 according to the present invention.

FIG. 4 is a schematic view of the work result of the sensing circuit 200 according to the present invention. According to the drift curves shown in FIG. 1, when ambient temperature is higher than 50° C., a drift of an output Ic of a Hall sensor 201 in a current drive mode is small; when the temperature is lower than 50° C., a drift of an output Vc of the Hall sensor 201 in a voltage drive mode is small; and especially when the temperature is lower than 0° C., the drift of the output Ic of the Hall sensor 201 in the current drive mode is far greater than the drift of the output Vc of the Hall sensor 201 in the voltage drive mode. Therefore, when the temperature drops to 50° C., the drive mode of the Hall sensor needs to be switched to voltage drive mode.

As shown in FIG. 4, when the temperature is higher than 50° C., the Hall sensor 201 is driven by a current drive circuit, and the output of the Hall sensor 201 is Ic (represented by a dotted line); and when the temperature is lower than 50° C., the Hall sensor 201 is switched to be driven by a voltage drive circuit, and the output of the Hall sensor 201 is Vc (represented by a solid line). In this way, the Hall sensor can always operate with a minimum output drift, so that operation stability of the sensor is improved.

Switching the drive mode at 50° C. as mentioned above is an ideal embodiment, but in fact, switching of the drive mode is determined according to the difference between outputs of the Hall sensor 201 in the two modes. For example, in FIG. 1, in a temperature region of 50° C. plus or minus 10° C. (that is, 40° C.-60° C.), the difference between outputs of the Hall sensor 201 in the current drive mode and the voltage drive mode is not big, and if the small difference can still enable the Hall sensor 201 to operate normally, the drive mode does not need to be switched. The range of the difference is determined according to needs of a customer.

Figure 5:
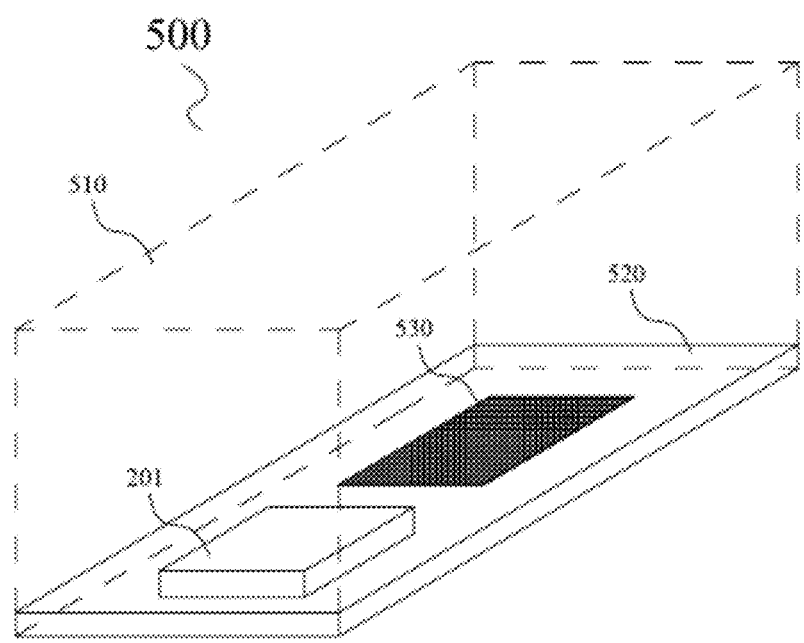
FIG. 5 is a schematic structural view of a sensor assembly 500 according to the present invention.

FIG. 5 is a schematic structural view of a sensor assembly 500 according to the present invention. As shown in FIG. 5, a driving apparatus (a drive circuit) 202 of a sensor 201 of the present invention is integrated in an integrated chip 530, and the sensor 201 and the integrated chip 530 are both mounted on a PCB board 520. The sensor assembly 500 is provided with a housing 510 and is a high integration assembly.

It should be understood that, although the present invention is described with reference to the embodiments shown in the accompanying drawings, various modifications may be made to the sensing circuit, the hybrid drive circuit, and the sensor assembly of the present invention without departing from the spirit and scope of the present invention. Persons of ordinary skill in the art may also appreciate that, various modifications made to the parameters in the embodiments disclosed by the present invention all fall within the sprit and scope of the present invention and the claims.

What is claimed is:

1. A sensing circuit, comprising:
a sensor; and
a driving apparatus connected to the sensor, wherein the driving apparatus is used to drive the sensor, wherein the driving apparatus comprises a current drive circuit and a voltage drive circuit;
the current drive circuit drives the sensor in a current drive mode, and the voltage drive circuit drives the sensor in a voltage drive mode; and
a switch apparatus connected to and controls the driving apparatus, to enable the driving apparatus to switch between the current drive mode and the voltage drive mode.

2. The sensing circuit according to claim 1, wherein the sensor is a Hall sensor, the Hall sensor senses a change in magnetic flux, and an output of the Hall sensor changes as the magnetic flux changes.

3. The sensing circuit according to claim 2, wherein when the voltage drive path is disconnected from the first path segment or the second path segment, the driving apparatus is a current-mode drive circuit; and
when the voltage drive path is connected in parallel to the first path segment and the second path segment, the driving apparatus is a voltage-mode drive circuit.

4. The sensing circuit according to claim 1, wherein the current drive circuit comprises a current drive path, the current drive path comprises a first path segment and a second path segment, and two ends of the sensor are connected to the first path segment and the second path segment respectively;
a current in the current drive path flows from the first path segment to the sensor, passes through the sensor, and flows out of the second path segment;
the voltage drive circuit comprises a voltage drive path; and
the switch apparatus connects the voltage drive circuit in parallel to the first path segment and the second path segment to form the voltage drive path, or disconnects the voltage drive circuit from the first path segment or the second path segment.

5. The sensing circuit according to claim 4, wherein the first path segment comprises a first resistor, and the second path segment comprises a second resistor.

6. The sensing circuit according to claim 4, wherein one end of the voltage drive path is connected to the switch apparatus, and the voltage drive path is connected in parallel to the first path segment and the second path segment by using the switch apparatus.

7. The sensing circuit according to claim 4, further comprising:
a switch control circuit, wherein an output of the switch control circuit is connected to an input of the switch apparatus, and the switch control circuit generates a control signal in a sensed ambient temperature range, wherein, in response to the control signal, the switch apparatus is in an on state or an off state;

when in the on state, the switch apparatus connects the voltage drive circuit in parallel to the first path segment and the second path segment; and when in the off state, the switch apparatus disconnects the voltage drive circuit from the first path segment or the second path segment.

8. The sensing circuit according to claim 7, wherein the switch control circuit comprises a comparator and a temperature testing circuit.

9. The sensing circuit according to claim 8, wherein the comparator is provided with a first input end, a second input end, and an output end;

the output end is connected to an input end of the switch apparatus;

the first input end is connected to a stable threshold voltage; and the second input end is connected to a sensing voltage output by the temperature testing circuit.

10. The sensing circuit according to claim 9, wherein the sensor has a temperature drift region;

the threshold voltage refers to a threshold voltage that causes the comparator to send the control signal when the temperature testing circuit senses that the ambient temperature reaches the temperature drift region;

the temperature drift region refers to a temperature region in which a zero drift of the sensor under current drive is greater than that of the sensor under voltage drive when no current passes through the sensor; and the zero drift refers to a state that an error signal is output by the sensor when a measured current is zero.

11. The sensing circuit according to claim 9, wherein the temperature testing circuit comprises a thermistor and multiple voltage dividing resistors;

the voltage dividing resistors comprise a third resistor and a fourth resistor that are connected in series, and comprise a fifth resistor connected in series to the thermistor;

the first input end is connected between the third resistor and the fourth resistor, so as to be connected to the threshold voltage formed through voltage dividing performed by the third resistor and the fourth resistor; and the second input end is connected between the thermistor and the fifth resistor, so as to be connected to the sensing voltage formed through voltage dividing performed by the thermistor.

12. The sensing circuit according to claim 7, wherein the sensed ambient temperature range comprises a first ambient temperature range and a second ambient temperature range;

the comparator outputs a first level control signal in the first ambient temperature range, and in response to the first level control signal, the switch apparatus is in the on state; and the comparator outputs a second level control signal in the second ambient temperature range, and in response to the second level control signal, the switch apparatus is in the off state.

13. The sensing circuit according to claim 12, wherein the first ambient temperature range is a temperature range lower than the temperature drift region; and the second ambient temperature range is a temperature range higher than the temperature drift region.

14. A hybrid drive circuit, for connecting to two ends of a driven electronic element to provide a driving power supply, the hybrid drive circuit comprising: a current drive circuit, a voltage drive circuit, a switch apparatus, and a switch control circuit, wherein the current drive circuit comprises a first circuit segment and a second circuit segment, and the first circuit segment and the second circuit segment are connected to two ends of the driven electronic element respectively, and form a current drive path;

the voltage drive circuit has a first end and a second end;

the switch apparatus has a first end and a second end, and the second end of the voltage drive circuit is connected to the first end of the switch apparatus;

the switch control circuit provides a control signal to the switch apparatus, and in response to the control signal, the switch apparatus is in an on state or an off state;

the first end of the voltage drive circuit and the second end of the switch apparatus are two output ends of the hybrid drive circuit, and the two output ends are connected to the two ends of the driven electronic element;

when in the on state, the switch apparatus enables the voltage drive circuit to be connected to the second end of the switch apparatus; and when in the off state, the switch apparatus enables the voltage drive circuit to be disconnected from the second end of the switch apparatus.

15. The hybrid drive circuit according to claim 14, wherein when in the on state or the off state, the switch apparatus enables the voltage drive circuit to be connected to the first circuit segment and the second circuit segment or to be disconnected from the first circuit segment or the second circuit segment.

16. The hybrid drive circuit according to claim 14, further comprising a first resistor and a second resistor, wherein the first circuit segment comprises the first resistor, and the second circuit segment comprises the second resistor.

17. The hybrid drive circuit according to claim 14, wherein the switch control circuit comprises a comparator and a temperature testing circuit, and the temperature testing circuit senses ambient temperature and outputs a sensing signal to the comparator.

18. The hybrid drive circuit according to claim 17, wherein the comparator is provided with a first input end, a second input end, and an output end;

the output end is connected to an input end of the switch apparatus;

the first input end is connected to a stable threshold voltage; and the second input end is connected to a sensing voltage output by the temperature testing circuit.

19. The hybrid drive circuit according to claim 18, wherein when the ambient temperature is in a first ambient temperature range, the output sensing voltage is higher than the threshold voltage, and the comparator outputs a first level control signal to the switch apparatus through the output end; and when the ambient temperature is in a second ambient temperature range, the sensing voltage is lower than the threshold voltage, and the comparator outputs a second level control signal to the switch apparatus through the output end.

20. The hybrid drive circuit according to claim 19, wherein
the first ambient temperature range is a temperature range lower than a temperature drift region; and
the second ambient temperature range is a temperature range higher than the temperature drift region.

21. The hybrid drive circuit according to claim 20, further comprising a Hall element having the temperature drift region,
wherein the temperature drift region refers to a temperature region in which a zero drift of the sensor under current drive is greater than that of the sensor under voltage drive when no current passes through the sensor; and
wherein the zero drift refers to a state that an error signal is output by the sensor when a measured current is zero.

22. The hybrid drive circuit according to claim 21, wherein
the threshold voltage refers to a threshold voltage that causes the comparator to send the control signal when the temperature testing circuit senses that the ambient temperature reaches the temperature drift region.

23. The hybrid drive circuit according to claim 19, wherein
when the comparator outputs the first level control signal, the switch apparatus, in response to the first level control signal, is in the on state; and
when the comparator outputs the second level control signal, the switch apparatus, in response to the second level control signal, is in the off state.

24. The hybrid drive circuit according to claim 18, wherein
the temperature testing circuit comprises a thermistor and multiple voltage dividing resistors;
the voltage dividing resistors comprise a third resistor and a fourth resistor that are connected in series, and comprise a fifth resistor connected in series to the thermistor;
the first input end is connected between the third resistor and the fourth resistor, so as to be connected to the threshold voltage formed through voltage dividing performed by the third resistor and the fourth resistor; and
the second input end is connected between the thermistor and the fifth resistor, so as to be connected to the sensing voltage formed through voltage dividing performed by the thermistor and the fifth resistor.

25. A sensor assembly, comprising:
a sensor; and
the hybrid drive circuit according to claim 14,
wherein the first circuit segment of the hybrid drive circuit is connected to a drive input end of the sensor, and the second circuit segment of the hybrid drive circuit is connected to another drive input end of the sensor.

* * * * *